(12) United States Patent
Lee et al.

(10) Patent No.: US 8,946,069 B2
(45) Date of Patent: Feb. 3, 2015

(54) FABRICATING METHOD OF SEMICONDUCTOR DEVICE AND SEMICONDUCTOR DEVICE FABRICATED USING THE SAME METHOD

(71) Applicant: Samsung Electronics Co., Ltd., Suwon-si (KR)

(72) Inventors: Jin-Wook Lee, Seoul (KR); Myeong-Cheol Kim, Suwon-si (KR); Sang-Min Lee, Hwaseong-si (KR); Young-Ju Park, Seoul (KR); Hyung-Yong Kim, Cheongju-si (KR); Myung-Hoon Jung, Suwon-si (KR)

(73) Assignee: Samsung Electronics Co. Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/138,721

(22) Filed: Dec. 23, 2013

(65) Prior Publication Data

US 2014/0110757 A1 Apr. 24, 2014

Related U.S. Application Data

(62) Division of application No. 13/213,364, filed on Aug. 19, 2011, now abandoned.

(30) Foreign Application Priority Data

Oct. 1, 2010 (KR) .......................... 10-2010-0095926

(51) Int. Cl.
*H01L 21/336* (2006.01)
*H01L 29/66* (2006.01)
(Continued)

(52) U.S. Cl.
CPC .... *H01L 29/66636* (2013.01); *H01L 21/26506* (2013.01); *H01L 21/30608* (2013.01);
(Continued)

(58) Field of Classification Search
CPC ....... H01L 21/336; H01L 21/88; H01L 29/78; H01L 21/26506; H01L 21/306; H01L 21/3065; H01L 21/823807; H01L 21/823814; H01L 21/66636
USPC ......... 438/157, 176, 195, 283, 585, 587, 588, 438/589, 705; 257/250, 331, E21.431, 257/E29.255, E29.264, E29.275, E29.319
See application file for complete search history.

(56) References Cited

U.S. PATENT DOCUMENTS

| 4,744,249 A | 5/1988 | Stewart |
| 6,037,222 A | 3/2000 | Huang et al. |

(Continued)

FOREIGN PATENT DOCUMENTS

| JP | 2008-078519 A | 4/2008 |
| KR | 10-2008-0087278 A | 10/2008 |

*Primary Examiner* — Selim Ahmed
(74) *Attorney, Agent, or Firm* — Lee & Morse, P.C.

(57) ABSTRACT

A fabricating method of a semiconductor device includes providing a substrate having a first region and a second region, forming a plurality of first gates in the first region of the substrate, such that the first gates are spaced apart from each other at a first pitch, forming a plurality of second gates in the second region of the substrate, such that the second gates are spaced apart from each other at a second pitch different from the first pitch, implanting an etch rate adjusting dopant into the second region to form implanted regions, while blocking the first region, forming a first trench by etching the first region between the plurality of first gates, and forming a second trench by etching the second region between the plurality of second gates.

14 Claims, 4 Drawing Sheets

(51) Int. Cl.
*H01L 21/265* (2006.01)
*H01L 21/306* (2006.01)
*H01L 21/3065* (2006.01)
*H01L 21/8234* (2006.01)
*H01L 21/8238* (2006.01)
*H01L 29/78* (2006.01)

(52) U.S. Cl.
CPC .... *H01L21/3065* (2013.01); *H01L 21/823412* (2013.01); *H01L 21/823425* (2013.01); *H01L 21/823807* (2013.01); *H01L 21/823814* (2013.01); *H01L 29/78* (2013.01)
USPC ...................................... 438/585; 257/E21.19

(56) References Cited

U.S. PATENT DOCUMENTS

| | | | |
|---|---|---|---|
| 7,494,856 | B2 | 2/2009 | Zhang et al. |
| 2001/0010390 | A1 | 8/2001 | Nomachi et al. |
| 2005/0189579 | A1* | 9/2005 | Adachi et al. ................. 257/314 |
| 2007/0102767 | A1 | 5/2007 | Cho et al. |
| 2008/0099882 | A1* | 5/2008 | Enicks ......................... 257/616 |
| 2009/0221123 | A1 | 9/2009 | Griebenow et al. |
| 2010/0210083 | A1 | 8/2010 | Fukuda et al. |
| 2011/0068439 | A1 | 3/2011 | Tsai et al. |
| 2011/0287600 | A1 | 11/2011 | Cheng et al. |

* cited by examiner

FABRICATING METHOD OF SEMICONDUCTOR DEVICE AND SEMICONDUCTOR DEVICE FABRICATED USING THE SAME METHOD

CROSS-REFERENCE TO RELATED APPLICATIONS

This is a divisional application based on pending application Ser. No. 13/213,364, filed Aug. 19, 2011, the entire contents of which is hereby incorporated by reference.

This application claims priority from Korean Patent Application No. 10-2010-0095926 filed on Oct. 1, 2010, in the Korean Intellectual Property Office, and all the benefits accruing therefrom under 35 U.S.C. 119, the contents of which in its entirety are herein incorporated by reference.

BACKGROUND

1. Field

Example embodiments relate to a fabricating method of a semiconductor device and a semiconductor device fabricated using the same method.

2. Description of the Related Art

In order to increase an operating current of a semiconductor device, there has recently been proposed research into methods for adjusting stress applied to a channel region by applying mechanical stress to the semiconductor device. That is to say, in the proposed research, the operating current may be improved, based on the principle that the mobility of carriers is affected when stress is produced in a channel region. For example, if compressive stress is produced in a channel region of a PMOS transistor, the mobility of hole carriers may be enhanced.

SUMMARY

Example embodiments provide a fabricating method of a semiconductor device, which can stabilize driving capabilities of transistors.

Example embodiments also provide a semiconductor device with transistors having stable driving capabilities.

These and other objects of the example embodiments will be described in or be apparent from the following description of the preferred embodiments.

According to an aspect of the example embodiments a fabricating method of a semiconductor device includes providing a substrate having a first region and a second region, forming a plurality of first gates in the first region of the substrate, such that the first gates are spaced apart from each other at a first pitch, forming a plurality of second gates in the second region of the substrate, such that the second gates are spaced apart from each other at a second pitch different from the first pitch, implanting an etch rate adjusting dopant into the second region to form implanted regions, while blocking the first region, forming a first trench by etching the first region between the plurality of first gates, and forming a second trench by etching the second region between the plurality of second gates.

Forming the first and second gates may include forming the first pitch to be greater than the second pitch.

Forming the second trench may include dry etching the implanted regions in the second region slower than dry etching the first region.

Implanting the etch rate adjusting dopant may include implanting elements of Group IV of the periodic table.

Forming the first trench and the second trench may include forming a first pre-trench in the first region between the plurality of first gates by dry etching, forming a second pre-trench in the second region between the plurality of second gates by dry etching, and performing wet-etching in each of the first and second pre-trenches to form the first trench and the second trench, respectively.

The dry etching may be an isotropical dry etching.

Implanting the etch rate adjusting dopant may include implanting the etch rate adjusting dopant to a same depth as a depth of the second pre-trench.

The wet etching may include use of tetramethyl ammonium hydroxide (TMAH) or ammonium hydroxide.

The first trench and the second trench may be formed to have a hexagonal profile.

The fabricating method may further include forming a first SiGe epitaxial layer in at least a portion of the first trench, and forming a second SiGe epitaxial layer in at least a portion of the second trench.

Forming the plurality of second gates in the second region may include forming a SRAM.

The fabricating method may further include, after forming the plurality of first gates and the plurality of second gates, forming a lightly doped drain (LDD) in the first region and the second region, such that implanting of the etch rate adjusting dopant is performed between formation of the first/second gates and formation of the LDD or performed after formation of the LDD.

Forming the second trench may include forming the second trench the implanted region of the second region, such that the first and second trenches have a substantially same depth.

Implanting the etch rate adjusting dopant may be performed using a tilted implant.

According to an aspect of the example embodiments a fabricating method of a semiconductor device includes providing a substrate having a first region and a second region, the second region having a higher density of gates thereon, implanting an etch rate adjusting dopant into the second region, while blocking the first region, and forming first and second trenches in the first and second regions, respectively, by dry etching.

Implanting the etch rate adjusting dopant may include implanting elements from Group IV of the periodic table.

The dry etching may be an isotropically dry etching.

Implanting the etch rate adjusting dopant may include implanting the etch rate adjusting dopant to a same depth as a depth of the second trench.

The dry etching in the first and second regions may be performed simultaneously, and the etch rate adjusting dopant slowing down the dry etching in the second region According to an aspect of the example embodiments a fabricating method of a semiconductor device includes providing a substrate having a first region and a second region, forming a plurality of first gates in the first region of the substrate, forming a plurality of second gates in the second region of the substrate, such that the second gates have a different pitch than the first gates, implanting an etch rate adjusting dopant only into one of the first and second regions to form an implanted region between adjacent respective gates, and etching the substrate to simultaneously form first and second trenches in the first and second regions, respectively, such that the first and second trenches are between adjacent respective gates and have a substantially same depth.

According to an aspect of the example embodiments a semiconductor device that includes a substrate having a first region and a second region defined therein, a plurality of first gates spaced apart from each other at a first pitch in the first region, a plurality of second gates spaced apart from each other at a second pitch different from the first pitch in the second region, a first trench in the first region between the plurality of first gates, a second trench in the second region between the plurality of second gates, a first SiGe epitaxial layer in at least a portion of the first trench, and a second SiGe epitaxial layer in at least a portion of the second trench, the first trench and the second trench having a same depth.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
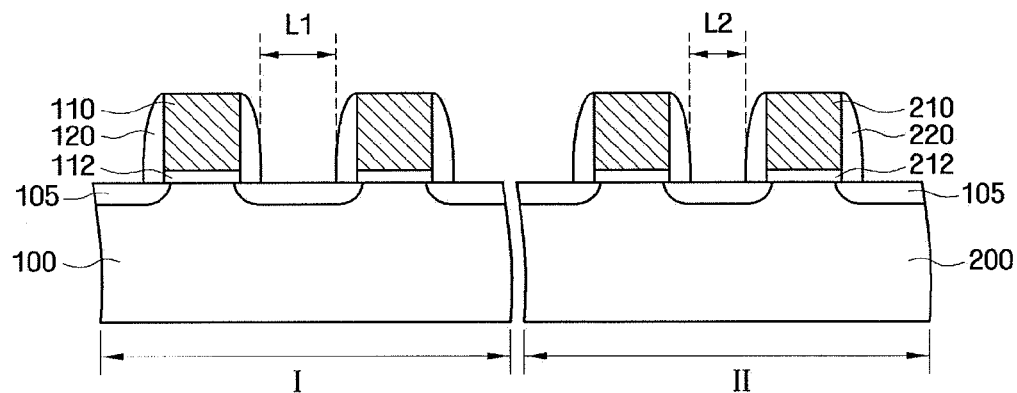
FIGS. 1 to 5 illustrate cross-sectional views of stages in a fabricating method of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

FIGS. 1 to 5 illustrate cross-sectional views of stages in a fabricating method of a semiconductor device according to an embodiment.

Referring to FIG. 1, a first region I and a second region II may be defined in substrates 100 and 200, respectively. PMOS transistors may be formed in the first region I and the second region II. It is noted, that while FIG. 1 illustrated two substrates, e.g., formed of a same material, a single substrate may be used, with first and second regions I and II defined therein.

A plurality of first gates 110 spaced apart from each other at a first pitch L1 may be formed in the first region I, and a plurality of second gates 210 spaced apart from each other at a second pitch L2, different from the first pitch L1, may be formed in the second region II. For example, the first pitch L1 may be greater than the second pitch L2, i.e., the second region II may have a higher density of gates than the first region I. That is to say, the spacing between the plurality of first gates 110 may be greater than the spacing between the plurality of second gates 210, i.e., a horizontal distance between two adjacent first gates 110 larger than a horizontal distance between two adjacent second gates 210.

Since the spacing between adjacent second gates 210 is smaller than the spacing between adjacent first gates 110, the second region II may have a to-be-etched region that is narrower than that of the first region I. Here, the to-be-etched region refers to a region to be etched later, so a region for subsequent etching between adjacent gates may be smaller, i.e., narrower along the horizontal direction, in the second region II than in the first region I. In other words, as will be described later with reference to FIGS. 2 to 4, since the first pitch L1 is greater than the second pitch L2, an area (or a width) of the first region I exposed by the first gates 110 is greater than an area of the second region II exposed by the second gates 210. Thus, the to-be-etched region of the first region I may be wider than that of the second region II. That is to say, a width of a first trench 132 along the horizontal direction may be greater than that of a second trench 232 (FIG. 4).

Referring back to FIG. 1, a first gate insulating layer 112 may be disposed between the first gate 110 and the substrate 100, and a second gate insulating layer 212 may be disposed between the second gate 210 and the substrate 200. First spacers 120 may be formed on sidewalls of the first gates 110, and second spacers 220 may be formed on sidewalls of the second gates 210.

Figure 2:
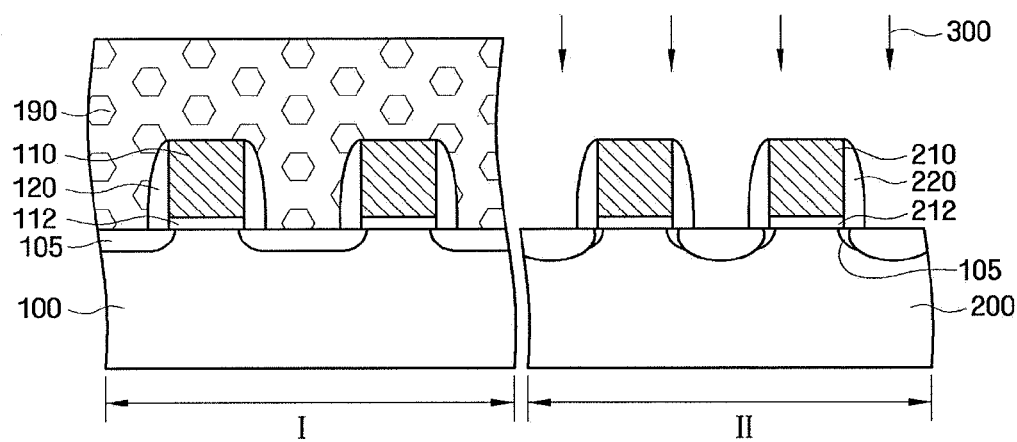

Referring to FIG. 2, an etch rate adjusting dopant 300 may be implanted into the second region II, while blocking the first region I using a mask 190. For example, the etch rate adjusting dopant may include Group IV elements of the periodic table, e.g., at least one of C, Si, and Ge. As Group IV elements do not act as donors or acceptors, source/drain regions may have little to no effect on a Group IV element.

The etch rate adjusting dopants may be implanted into the substrate 200 in regions between adjacent second gates 210 to form implanted regions 222. The etch rate adjusting dopants may be implanted to a predetermined depth, so a depth of the implanted region 222 may be the same as a depth d2 (FIG. 3) of a second pre-trench 231 to be formed in a subsequent process.

For example, the depth of the etch rate adjusting dopant 300 may vary according to an extent of a desired compressive stress to be applied to a channel region of the PMOS transistor in the first region I and a compressive stress applied to a channel region of the PMOS transistor in the second region II.

Figure 3:
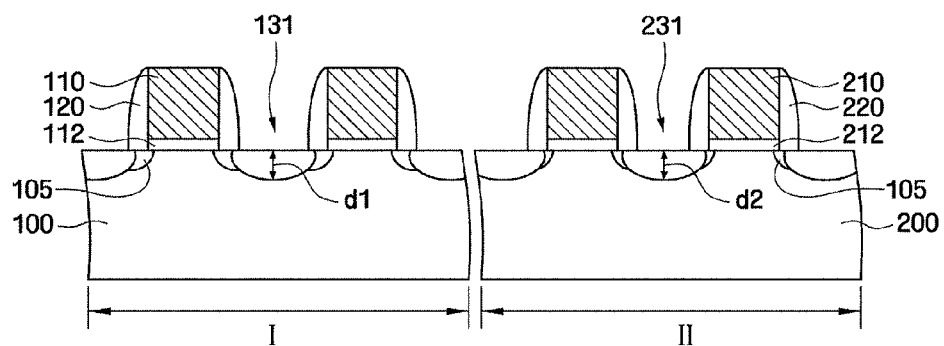
Figure 4:
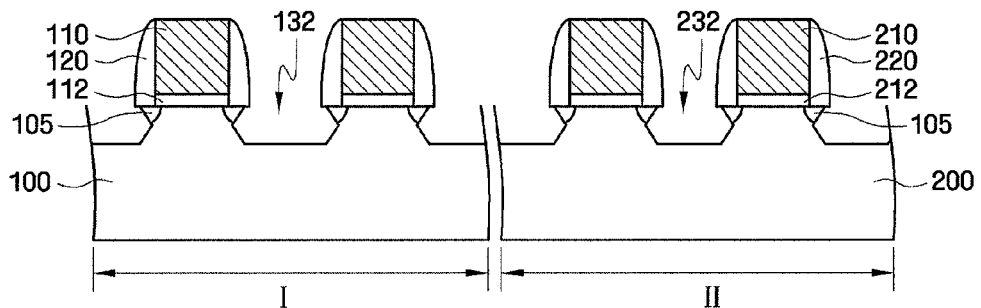

Referring to FIG. 3, a first pre-trench 131 may be formed in the first region I of the substrate 100 among the plurality of first gates 110, e.g., one first pre-trench 131 may be formed between every two adjacent first gates 110, and a second pre-trench 231 may be formed in the second region II of the substrate 200 among the plurality of second gates 210, e.g., one second pre-trench 231 may be formed between every two adjacent second gates 210. The first and second pre-trenches 131 and 231 may be formed in the substrates 100 and 200, respectively, using dry etching, e.g., isotropically dry etching. For example, if no bias power is applied to a chuck in dry etching equipment during the dry etching, the isotropically dry etching may be performed in the dry etching equipment.

The first and second pre-trenches 131 and 231 may be formed to depths d1 and d2, respectively. The depth d1 of the first pre-trench 131 may equal the depth d2 of the second pre-trench 231, i.e., as measured from a bottom of each pre-trench to an imaginary line representing an upper surface of a corresponding substrate. As the second region II includes the implanted regions 222, i.e., as the second pre-trenches 232 are formed in regions of the implanted regions 222 that include the etch rate adjusting dopants 300, as described previously with reference to FIG. 2, an etch rate of the dry etching performed in the second region II may be smaller than that of the dry etching performed in the first region I. In other words, as the etch rate adjusting dopants 300 are foamed only in the second region II and affect the etch rate, the etch rate in the second region II, as compared to the first region I, may be adjusted to be slower in accordance with the etch rate adjusting dopants 300 in order to achieve a same pre-trench depth as in region I.

Conventionally, i.e., a method without using etch rate adjusting dopants, if an area (or width) of a first region I exposed by first gates is greater than that of a second region II exposed by second gates, use of simultaneous etching in both regions I and II may cause formation of pre-trenches in the second regions that have greater depths than those of the pre-trenches in the first region. However, in the fabricating method of a semiconductor device according to example embodiment, etch rate adjusting dopants are implanted, e.g., only, in region II. As such, despite the simultaneous etching of the first and second regions I and II, the etch rate adjusting dopants in the second region II slow down the etching therein. That is, the etch rate of the dry etching in the second region II may be slower than the etch rate in the first region I, i.e., a region without etch rate adjusting dopants, so the depth of the second pre-trenches 231 and first pre-trench 131 may be adjusted to be the same, even though the exposed area between adjacent first gates 110 is greater than the exposed area between adjacent second gates 210. In other words, use of the etch rate adjusting dopants may be controlled, so a same etch rate in areas of different sizes may provide pre-trenches with a same depth, i.e., the depth d1 of the first pre-trench 131 may equal the depth d2 of the second pre-trench 231.

Referring to FIG. 4, wet etching may be performed on the first pre-trench 131 and the second pre-trench 231 to complete the first trench 132 and the second trench 232. For example, tetramethyl ammonium hydroxide (TMAH) or ammonium hydroxide may be used as an etching solution I the wet etching. The etching solution performs etching along crystalline surfaces of the substrates 100 and 200. Thus, as the result of the wet etching, the first trench 132 and the second trench 232 may have a hexagonal profile (or a sigma shape).

Figure 5:
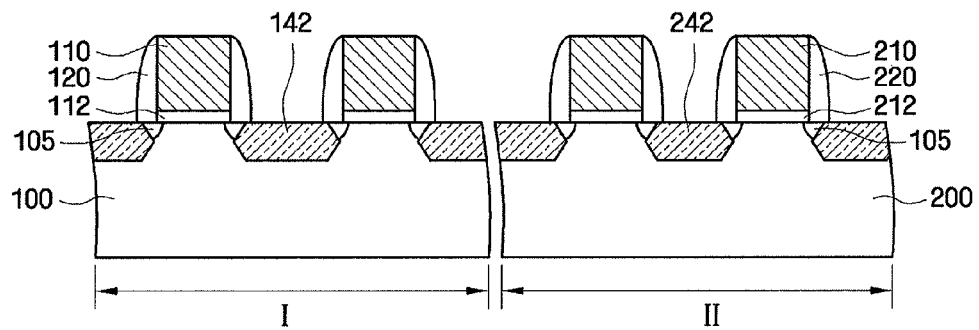

Referring to FIG. 5, a first SiGe epitaxial layer 142 filling at least a portion of the first trench 132 may be formed, and a second SiGe epitaxial layer 242 filling at least a portion of the second trench 232 may be formed. For example, when the first SiGe epitaxial layer 142 and the second SiGe epitaxial layer 242 are grown, e.g., during growth thereof, a p-type dopant may be added, thereby completing source/drain regions of the first SiGe epitaxial layer 142 and the second SiGe epitaxial layer 242. In another example, after the first SiGe epitaxial layer 142 and the second SiGe epitaxial layer 242 are grown, a p-type dopant may be implanted into the substrates 100 and 200 using a separate implantation process, thereby completing source/drain regions.

Hereinafter, a fabricating method of a semiconductor device according to another embodiment will be described.

Referring to FIGS. 1-2, after forming a plurality of first gates 110 and a plurality of second gates 210, a lightly doped drain (LDD) 105 may be formed in the first region I and the second region II. For example, the implanting (300) of the etch rate adjusting dopant may be performed between formation of the first/second gates 110/120 and formation of the LDD, i.e., formation of the LDD may be performed after formation of the implanted regions 222 in FIG. 2. In another example, the implanting (300) of the etch rate adjusting dopant may be performed after the forming of the LDD, i.e., formation of the LDD may be performed between the stages illustrated in FIGS. 1 and 2.

Further, according to the other embodiment, first additional spacers may be formed on sidewalls of the plurality of first spacers 120, and second additional spacers may be formed on sidewalls of the plurality of second spacers 220. The implanting (300) of the etch rate adjusting dopant may be performed after forming the first additional spacers and the second additional spacers. Here, the implanting (300) of the etch rate adjusting dopant may be performed using a tilted implant.

A semiconductor device according to example embodiments, as illustrated in FIG. 5, may include a substrate having a first region I and a second region II defined therein, the plurality of first gates 110 spaced apart from each other at the first pitch in the first region I, the plurality of second gates 210 spaced apart from each other at the second pitch different from the first pitch in the second region II, the first trench 132 formed in the first region I between the plurality of first gates 110, the second trench 232 formed in the second region II between the plurality of second gates 210, the first SiGe epitaxial layer 142 filling at least a portion of the first trench 132, and the SiGe epitaxial layer 242 filling at least a portion of the second trench 232.

In the semiconductor device according to example embodiments, irrespective of the density of the first gates 110 and the second gates 210, the depths of the first trench 132 and the second trench 232 may be adjusted. Accordingly, the depth of the first SiGe epitaxial layer 142 filling the first trench 132 and the depth of the second SiGe epitaxial layer 242 filling the second trench 232 may be adjusted. Therefore, it may be possible to adjust the magnitude of the compressive stress applied to the channel region of the PMOS transistor in the first region I and the magnitude of the compressive stress applied to the channel region of the PMOS transistor in the second region II.

Figure 6:
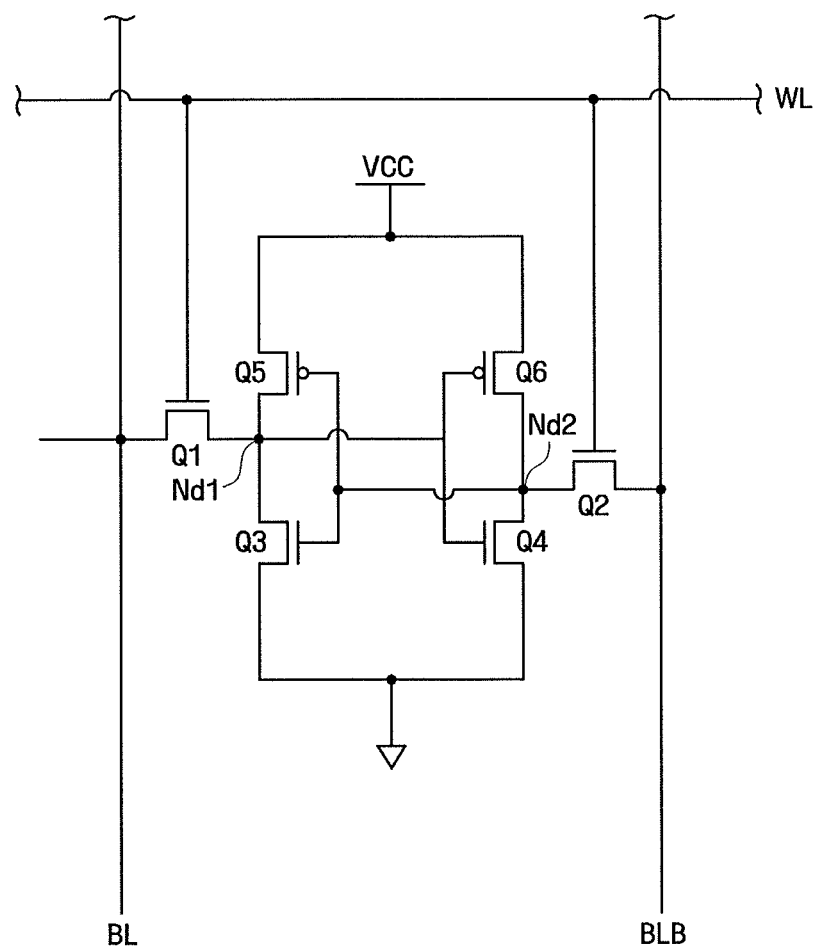
FIG. 6 illustrates a circuit diagram of a full CMOS SRAM.
Figure 7:
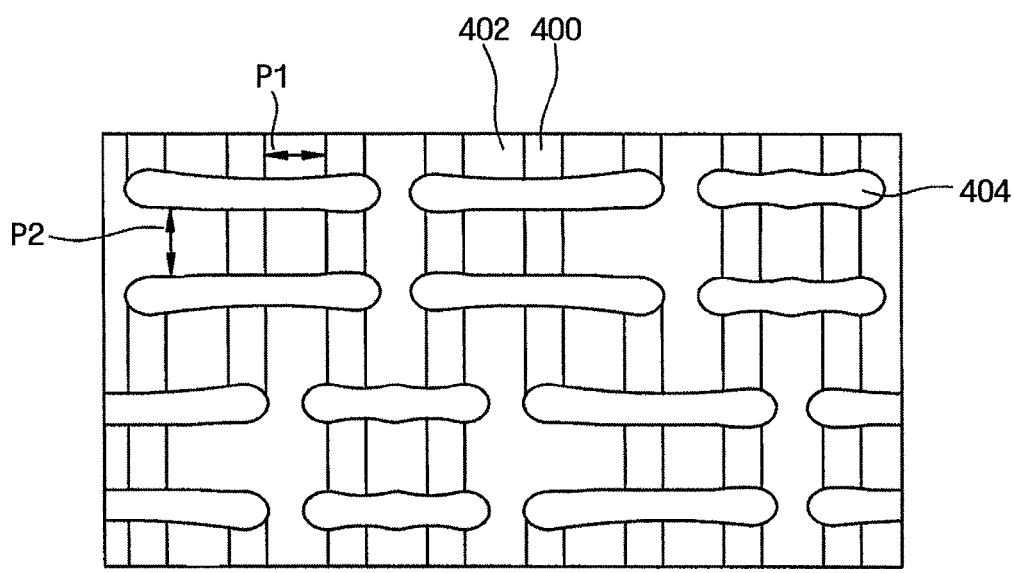
FIG. 7 illustrates a layout view of active patterns and a gate of the SRAM shown in FIG. 6.

For example, depths of the first trench 132 and the second trench 232 may be adjusted to be equal to each other. Thus, depths of the first SiGe epitaxial layer 142 and the second SiGe epitaxial layer 242 filling the first trench 132 and filling the second trench 232, respectively, may also be adjusted to be equal to each other. Therefore, it may also be possible to adjust the magnitudes of the compressive stress applied to the channel region of the PMOS transistor in the first region I and the compressive stress applied to the channel region of the PMOS transistor in the second region II to be equal to each other. Accordingly, in the semiconductor device according to example embodiments, the driving capability of the PMOS transistor may be stabilized, which will be described in greater detail with reference to FIGS. 6 and 7 below. FIGS. 6 and 7 illustrate a Static random-access memory (SRAM) that is a full CMOS SRAM, but the invention is not limited thereto. FIG. 6 is a circuit diagram of a full CMOS SRAM, and FIG. 7 is a layout view illustrating active patterns and a gate of the SRAM shown in FIG. 6.

First, an SRAM will briefly be described with reference to FIG. 6. The SRAM may include first and second pass transistors Q1 and Q2 connecting a bit line BL and a bit line bar BLB to memory cell nodes Nd1 and Nd2, respectively, a word line WL activated to 'high' and connected to gates of the first and second pass transistors Q1 and Q2, a PMOS transistor Q5 connected between a power supply voltage Vcc and the memory cell node Nd1, and an NMOS transistor Q3 connected between the memory cell node Nd1 and a ground voltage Vss. The PMOS transistor Q5 and the NMOS transistor Q3 are controlled by a signal of the memory cell node Nd2, and supply the power supply voltage Vcc and the ground voltage Vss, respectively, to the memory cell node Nd1.

The SRAM may also include a PMOS transistor Q6 connected between the power supply voltage Vcc and the memory cell node Nd2 and an NMOS transistor Q4 connected between the memory cell node Nd2 and the ground voltage Vss. The PMOS transistor Q6 and the NMOS transistor Q4 are controlled by a signal of the memory cell node Nd1, and supply the power supply voltage Vcc or the ground voltage Vss, respectively, to the memory cell node Nd2.

The first pass transistor Q1, the NMOS transistor Q3, i.e., a driving transistor, and the PMOS transistor Q5, i.e., a pull-up transistor, meet at the memory cell node Nd1 that stores data. In addition, the second pass transistor Q2, i.e., an access transistor, the NMOS transistor Q4, i.e., a driving transistor, and the PMOS transistor Q6, i.e., a pull-up transistor, are engaged with each other in the same manner.

Referring to FIG. 7, line-shaped active patterns 400 are arranged to have spaces 402 therebetween i.e., at a third pitch P1. A plurality of gates 404 may be arranged on the active patterns 400 at a fourth pitch P2 to be perpendicular to the active patterns 400. For example, the third pitch P1 may equal the fourth pitch P2. The plurality of gates 404 may have a stacked structure of a gate oxide layer and a conductive layer. The gates 404 may be provided as gate electrodes of PMOS or NMOS transistors.

As described above, the extent of etching may vary according to the area exposed by the etching. As shown in FIG. 7, the active patterns 400 of the SRAM may have narrow widths, and the third pitch P1 between the active patterns 400 may not be constant according to the type of processing used. In addition, the fourth pitch P2 between the plurality of gates 404 may not be constant either. Thus, it may be difficult to achieve ensured driving capabilities of the plurality of transistors Q1 to Q6 in a conventional SRAM.

That is, conventionally, when a SiGe layer is formed in a trench of a source/drain region of a conventional PMOS transistor, i.e., to apply compressive stress to the channel region of the PMOS transistor, a loading effect may be generated according to the density of a gate in the PMOS transistor, so a size (or depth) of the trench may vary. In other words, a depth of the SiGe layer filling the trench may vary according to the density of the gate in the PMOS transistor, e.g., due to different etching rates in regions having different densities, so the magnitude of the compressive stress applied to the channel region of the PMOS transistor may not be constant. As such, the driving capability of the conventional PMOS transistor may be unstable.

However, according to the fabricating methods of the semiconductor device of the example embodiments, the driving capabilities of the plurality of transistors Q1 to Q6 may be appropriately adjusted even if the third pitch P1 and the fourth pitch P2 are not constant. That is, an etch rate adjusting dopant may be implanted into regions to be etched in accordance with varying densities of gates of transistors, so the etch rate adjusting dopant may slow etching in denser regions of the substrate in order to provide same constant trench depths and constant compressive stress.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:

1. A fabricating method of a semiconductor device, comprising:
   providing a substrate having a first region and a second region;
   forming a plurality of first gates in the first region, such that the first gates are spaced apart at a first pitch;
   forming a plurality of second gates in the second region, such that the second gates are spaced apart at a second pitch different from the first pitch;
   implanting etch rate adjusting dopants in regions between the adjacent second gates, while blocking the first region;
   simultaneously etching the first region and the second region so as to form a first plurality of trenches in the first region and a second plurality of trenches in the second region, wherein a depth of the first plurality of trenches and a depth of the second plurality of trenches are substantially equal; and
   epitaxially growing a semiconductor material in the first and the second plurality of trenches.

2. The fabricating method of the claim 1, wherein the first pitch is greater than the second pitch.

3. The fabricating method of the claim 1, wherein the etch rate adjusting dopants are selected from elements of Group IV of the periodic table.

4. The fabricating method of the claim 1, wherein the semiconductor material includes an element different from silicon.

5. The fabricating method of the claim 1, wherein the semiconductor material has a lattice constant different from the lattice constant of silicon.

6. The fabricating method of the claim 1, wherein the first and the second plurality of trenches are formed to have substantially hexagonal profiles or sigma shapes.

7. A fabricating method of a semiconductor device, comprising:
   providing a substrate having a first region and a second region;
   forming a plurality of first gates in the first region, such that the first gates are spaced apart at a first pitch;
   forming a plurality of second gates in the second region, such that the second gates are spaced apart at a second pitch different from the first pitch;
   implanting etch rate adjusting dopants in a region between the adjacent second gates, while blocking the first region;
   simultaneously etching the first region and the second region so as to form a trench in the first region and a second trench in the second region, wherein a depth of the first trench and a depth of the second trench are substantially equal; and epitaxially growing a semiconductor material in the first and the second plurality of trenches.

8. The fabricating method of the claim 7, wherein the first pitch is greater than the second pitch.

9. The fabricating method of the claim 7, wherein the etch rate adjusting dopants are selected from elements of Group IV of the periodic table.

10. The fabricating method of the claim 7, wherein the semiconductor material includes an element different from silicon.

11. The fabricating method of the claim 7, wherein the semiconductor material has a lattice constant different from a lattice constant of silicon.

12. The fabricating method of the claim 7, wherein the first trench and the second trench are formed to have substantially a hexagonal profile or a sigma shape.

13. The fabricating method of the claim 7, further comprising implanting the etch rate adjusting dopants in the region between the adjacent second gates in accordance with varying densities of the first gates and the second gates, in order to provide substantially equal depths of the first trench and the second trench.

14. The fabricating method of the claim 1, further comprising implanting the etch rate adjusting dopants in the region between the adjacent second gates in accordance with varying densities of the first gates and the second gates, in order to provide substantially equal depths of first plurality of trenches and the second plurality of trenches.

* * * * *